United States Patent
Kawai et al.

(10) Patent No.: US 6,488,908 B1
(45) Date of Patent: Dec. 3, 2002

(54) SPINEL FERRITE THIN FILM AND METHOD OF MANUFACTURING THE SAME

(75) Inventors: Tomoji Kawai, Minoo (JP); Hitoshi Tabata, Suita (JP); Yuji Muraoka, Minoo (JP)

(73) Assignee: President of Osaka University, Suita (JP)

( * ) Notice: Subject to any disclaimer, the term of this patent is extended or adjusted under 35 U.S.C. 154(b) by 0 days.

(21) Appl. No.: 09/652,011

(22) Filed: Aug. 31, 2000

(30) Foreign Application Priority Data

Feb. 14, 2000 (JP) ........................ 2000-035119

(51) Int. Cl.$^7$ ................. C01G 49/00; C01G 23/00; C01D 1/00; C01F 11/00; C01F 5/00
(52) U.S. Cl. ..................................... 423/594
(58) Field of Search .......................... 423/594

(56) References Cited

U.S. PATENT DOCUMENTS

| | | | | |
|---|---|---|---|---|
| 4,624,901 A | * | 11/1986 | Glass ......................... | 428/469 |
| 5,698,131 A | * | 12/1997 | Saitou et al. ................ | 423/594 |
| 6,193,904 B1 | * | 2/2001 | Schoch, Jr. et al. ......... | 423/594 |

FOREIGN PATENT DOCUMENTS

EP 389297 * 9/1990

OTHER PUBLICATIONS

Fuji, et al., "Preparation of Co Ferrite Film . . . Vapor Deposition," Jpn. J. Appl. Phys., Part 1, 1995, Jan., 34(1), pp. 130–131.*

Suzuki, et al., "Preparation of Zinc–and . . . Faraday Rotation," Jpn. J. Appl. Phys., Part 1, 1988, Mar., 27(3), pp. 361–365.*

Yamazaki, et al., "Preparation of cobalt zinc ferrite thin films . . . " IEEE Trans. Magn., 1987, no month, MAG–23(5, Pt.2), pp. 3320–3322.*

Mirebeau, et al., "Neutron study of the spinel . . . interaction", J. of Magnetism and Mag. Materials, 169, 1997, no month, 279–88.*

Purushotham, et al., "Thermopower and electrical . . . ferrites", Phys. Status Solidi A, 1993, no month, 140(2), K89–K94.*

Persoons, et al., "Resolution of the A and B–site . . . state", Hyperfine Interact., 1990, no month, 54(1–4), 661–6.*

"Extended Abstracts (The 60$^{th}$ Autumn Meeting, 1999); The Japan Society of Applied Physics", No. 1, Nov. 1999, pp. 1, 45, and 122.

* cited by examiner

*Primary Examiner*—Steven Bos
(74) *Attorney, Agent, or Firm*—Oblon, Spivak, McClelland, Maier & Neustadt, P.C.

(57) ABSTRACT

A substrate and a target are disposed within a vacuum chamber, and an oxygen partial pressure within the vacuum chamber is set to $1 \times 10^{-5}$ or less. Under this condition, a spinel ferrite thin film selected from the group consisting of compounds represented by the formula $AE_{1+t}Fe_{2-2t}TM_tO_4$, where AE represents an alkaline earth metal or an alkali metal, TM represents a transition metal and t falls within a range of between 0.2 and 0.6, and compounds represented by the formula $Zn_{1-x}Co_xFe_2O_4$, where x falls within a range of between 0.2 and 0.7, is deposited on the substrate by laser beam deposition. The particular method makes it possible to provide a spinel ferrite thin film realizing a spin glass state under temperatures around or higher than room temperature and capable of controlling the spin state by light.

3 Claims, 5 Drawing Sheets

SPINEL FERRITE THIN FILM AND METHOD OF MANUFACTURING THE SAME

CROSS-REFERENCE TO RELATED APPLICATIONS

This application is based upon and claims the benefit of priority from the prior Japanese Patent Application No. 2000-035119, filed Feb. 14, 2000, the entire contents of which are incorporated herein by reference.

BACKGROUND OF THE INVENTION

The present invention relates to a spinel ferrite thin film exhibiting a high-temperature spin glass state and capable of spin control by light and a method of manufacturing the same.

A magneto-optical recording medium (MO) is known to the art as one of the magnetic recording media that have put to a practical use at present. In the conventional magneto-optical recording medium, a structural change is brought about within a recording medium by using a laser as a heat source so as to carry out recording. However, since a structural change is brought about by heat in the conventional medium, shortening in recording speed is limited. Since improvements in recording speed and in processing speed are required with recent increase in data, it is required to develop a magneto-optical recording medium in which data can be recorded directly with light, not with heat.

In a spin glass material, it is expected that magnetic properties, specifically its spin, can be controlled by light irradiation. Therefore, the spin glass material is a prominent candidate for a new magneto-optical recording medium. However, many spin glass materials exhibit the spin glass state only under very low temperatures such as 50 K or lower. This is because spin exchange interaction that determines a temperature at which the spin glass state is exhibited is low. Therefore, elevation of temperature at which the glass phenomenon is exhibited is a serious problem to be solved for putting the spin glass material to a practical use.

As examples of the material that exhibits the spin glass state at a high temperature such as room temperature, bulk $Zn_{0.5}Co_{0.5}Fe_2O_4$ (spin freezing temperature $T_f=320$ K) and an amorphous film of $CoFe_2O_4$ ($T_f=284$ K) have been reported to date. However, in order to use a spin glass material as a memory material, it is required to increase the width of selection of materials that achieve a spin glass state at temperatures around room temperature. In addition, concerning the above two materials, no report has yet been made relating to control of the spin state by light.

BRIEF SUMMARY OF THE INVENTION

An object of the present invention is to provide a spinel ferrite thin film capable of exhibiting a spin glass state under temperatures around or higher than room temperature and capable of controlling the spin state by light, and a method of manufacturing the same.

According to a first aspect of the present invention, there is provided a spinel ferrite thin film selected from the group consisting of compounds represented by the formula:

$$AE_{1+t}Fe_{2-2t}TM_tO_4$$

where AE represents an alkaline earth metal or an alkali metal, TM represents a transition metal, and t falls within a range of between 0.2 and 0.6, i.e., $0.2 \leq t \leq 0.6$, and compounds represented by the formula:

$$Zn_{1-x}Co_xFe_2O_4$$

where x falls within a range of between 0.2 and 0.7, i.e., $0.2 \leq x \leq 0.7$.

In the spinel ferrite thin film of the present invention, the alkaline earth metal or the alkali metal is selected from the group consisting of magnesium and lithium, and the transition metal is selected from the group consisting of cobalt, titanium, zinc, vanadium, manganese, chromium and nickel.

According to a second aspect of the present invention, there is provided a method of manufacturing a spinel ferrite thin film, comprising steps of:

disposing a substrate and a target within a vacuum chamber, followed by setting an oxygen partial pressure within the vacuum chamber to $1 \times 10^{-5}$ Torr or less; and depositing by a laser beam deposition a spinel ferrite thin film selected from the group consisting of compounds represented by the formula:

$$AE_{1+t}Fe_{2-2t}TM_tO_4$$

where AE represents an alkaline earth metal or an alkali metal, TM represents a transition metal, and t falls within a range of between 0.2 and 0.6, i.e., $0.2 \leq t \leq 0.6$, and compounds represented by the formula:

$$Zn_{1-x}Co_xFe_2O_4$$

where x falls within a range of between 0.2 and 0.7, i.e., $0.2 \leq x \leq 0.7$.

In the method of the present invention, it is desirable for the substrate to be selected from the group consisting of a sapphire single crystal and a strontium titanate single crystal.

According to a third aspect of the present invention, there is provided a method of controlling magnetization of a spinel ferrite thin film by light, comprising steps of:

applying at least 30% of a magnetic field relative to coercive force Hc to the spinel ferrite thin film; and irradiating the spinel ferrite thin film with light, while applying the magnetic field to the thin film, so as to increase the magnetization of the thin film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
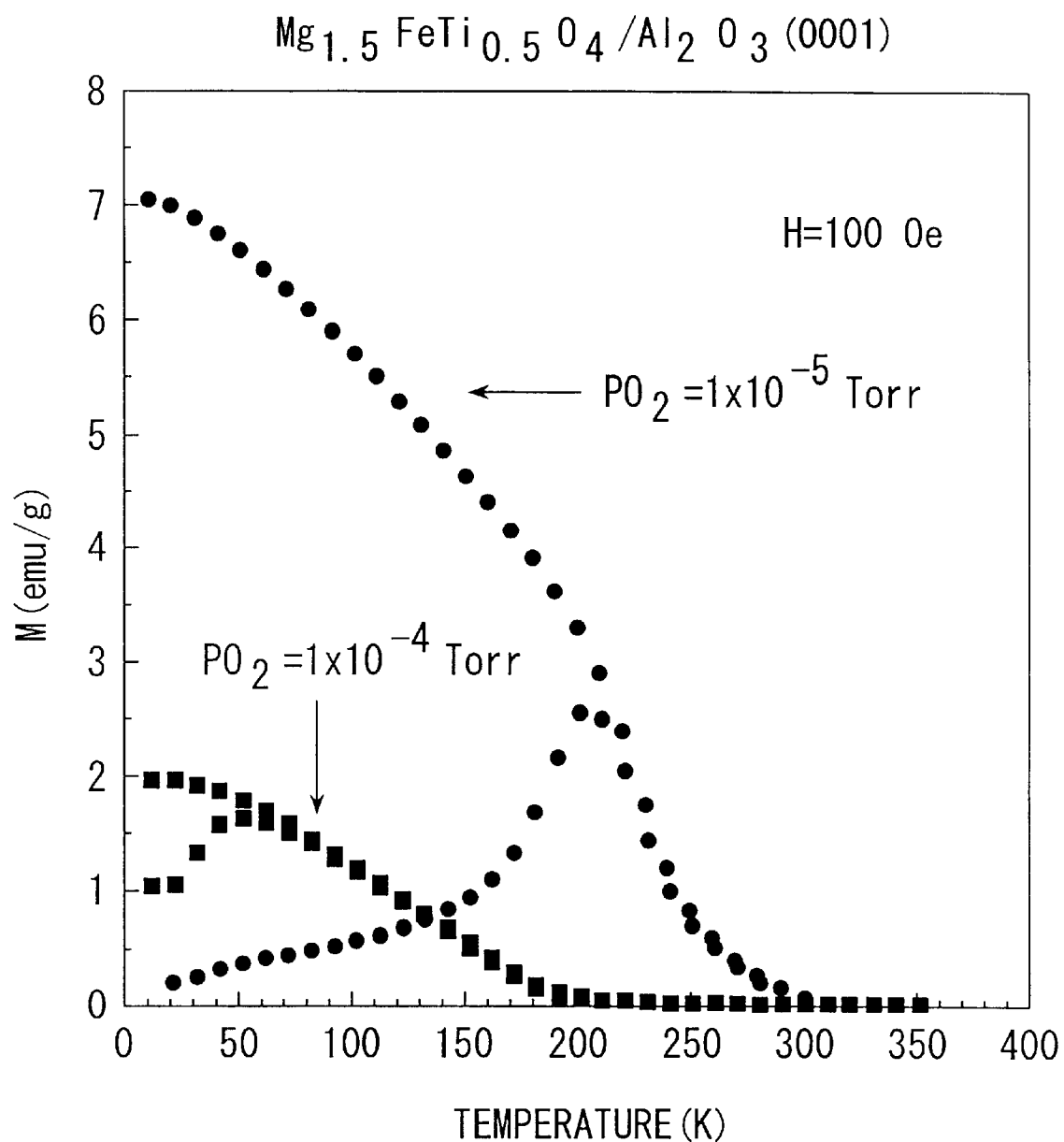
FIG. 1 is a graph showing temperature dependency of magnetic susceptibility for each of $Mg_{1.5}FeTi_{0.5}O_4$ thin films formed on a sapphire single crystal substrate under oxygen partial pressures of $1 \times 10^{-5}$ Torr and $1 \times 10^{-4}$ Torr, respectively.

The present invention will now be described more in detail.

A spinel ferrite thin film of the present invention is represented by the formula (1):

$$AE_{1+t}Fe_{2-2t}TM_tO_4 \qquad (1)$$

where AE represents an alkaline earth metal or an alkali metal, TM represents a transition metal, and t falls within a range of between 0.2 and 0.6, i.e., $0.2 \leq t \leq 0.6$, or by the formula (2):

$$Zn_{1-x}Co_xFe_2O_4 \qquad (2)$$

where x falls within a range of between 0.2 and 0.7, i.e., $0.2 \leq x \leq 0.7$.

The term "thin film" used in the present invention implies that the thickness of the film is not larger than 10 μm.

A typical compound represented by the formula (1) is:

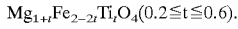

$$Mg_{1+t}Fe_{2-2t}Ti_tO_4(0.2 \leq t \leq 0.6).$$

The compound represented by the above formula is obtained by substituting nonmagnetic ions ($Mg^{2+}$, $Ti^{4+}$) for a part of Fe ions of spinel ferrite ($Fe_3O_4$). It is possible to use lithium in place of Mg. It is also possible to use vanadium, manganese, chromium or nickel in place of Ti.

In the method of the present invention, a substrate made of, for example, a sapphire single crystal or a strontium titanate single crystal and a target are placed in a vacuum chamber, followed by setting an oxygen partial pressure within the vacuum chamber at $1 \times 10^{-5}$ Torr or less, and then laser beam deposition is performed, thereby depositing on the substrate the spinel ferrite thin film represented by the formula (1) or (2).

The substrate employed is a sapphire single crystal of a (0001) plane having a lattice constant a=4.758 Å, c=12.991 Å, or a strontium titanate single crystal of a (111) plane having a lattice constant of 3.90 Å.

If a spinel ferrite thin film of a predetermined composition having a thickness of 10 μm or less is deposited on a substrate having a predetermined lattice constant with controlling the oxygen partial pressure, it is possible to control a valence of iron ion within the lattice of the thin film at a mixed valence between divalence and trivalence as well as to introduce a lattice distortion into the thin film. As a result, it is possible to increase the spin exchange interaction within the thin film so as to raise the spin freezing temperature. When it comes to a $Mg_{1+t}Fe_{2-2t}Ti_tO_4$ thin film (t=0.35) formed on a sapphire substrate, for example, the spin glass state is maintained up to 370 K.

In the spinel ferrite thin film of the present invention, the magnetization can be increased by irradiating the thin film with light while applying at least 30% of a magnetic field relative to coercive force Hc, so as to make it possible to control the spin glass state by light at room temperature.

EXAMPLES

Examples of the present invention will now be described.

Example 1

The effect of oxygen partial pressure during formation of a spinel ferrite thin film was examined by depositing the thin film under various conditions of oxygen partial pressure.

A sapphire single crystal substrate ($\alpha$-$Al_2O_3$) having a (0001) plane and a $Mg_{1+t}Fe_{2-2t}Ti_tO_4$(t=0.5) target were disposed in a laser deposition apparatus, followed by evacuating the apparatus to a high vacuum. An oxygen gas was introduced into the apparatus to set a pressure to $1 \times 10^{-5}$ Torr or $1 \times 10^{-4}$ Torr. Then, the substrate temperature was set at 350 to 550° C., and the target was irradiated with a laser beam having a wavelength of 193 nm emitted from an ArF excimer laser so as to deposit a $Mg_{1.5}FeTi_{0.5}O_4$ spinel ferrite thin film having a thickness of 660 nm on the substrate.

FIG. 1 shows temperature dependency of magnetic susceptibility for the $Mg_{1.5}FeTi_{0.5}O_4$ thin films. In FIG. 1, ZFC denotes the result of the measurement under a zero magnetic field, while FC denotes the result of the measurement under a magnetic field. As shown in the graph, the spin freezing temperature (200 K) of the thin film deposited under the oxygen partial pressure of $1 \times 10^{-5}$ Torr is higher than the spin freezing temperature (50 K) of the thin film deposited under the oxygen partial pressure of $1 \times 10^{-4}$ Torr. Clearly, it is desirable to deposit the thin film under the oxygen partial pressure of $1 \times 10^{-5}$ Torr.

Incidentally, bulk $Mg_{1.5}FeTi_{0.5}O_4$ is reported to exhibit a behavior like spin glass at a low temperature (22 K). However, the spin freezing temperature of the thin film deposited under an oxygen partial pressure of $1 \times 10^{-5}$ Torr is higher by 180 K than the temperature of 22 K noted above. It is considered reasonable to understand that the thin film differs from the bulk body in the valence of the iron ion within the lattice, giving rise to difference in spin exchange interaction between the thin film and the bulk.

Example 2

Spinel ferrite thin films having different compositions were prepared to compare their characteristics.

A sapphire single crystal substrate ($\alpha$-$Al_2O_3$) having a (0001) plane and a $Mg_{1+t}Fe_{2-2t}Ti_tO_4$(t=0.4 or 0.35) target were disposed in a laser deposition apparatus, followed by evacuating the apparatus to a high vacuum. An oxygen gas was introduced into the apparatus to set a pressure to $1 \times 10^{-5}$ Torr. Then, a spinel ferrite thin film represented by $Mg_{1+t}Fe_{2-2t}Ti_tO_4$ (t=0.4 or 0.35) was formed on the sapphire substrate as in Example 1.

Figure 2A:
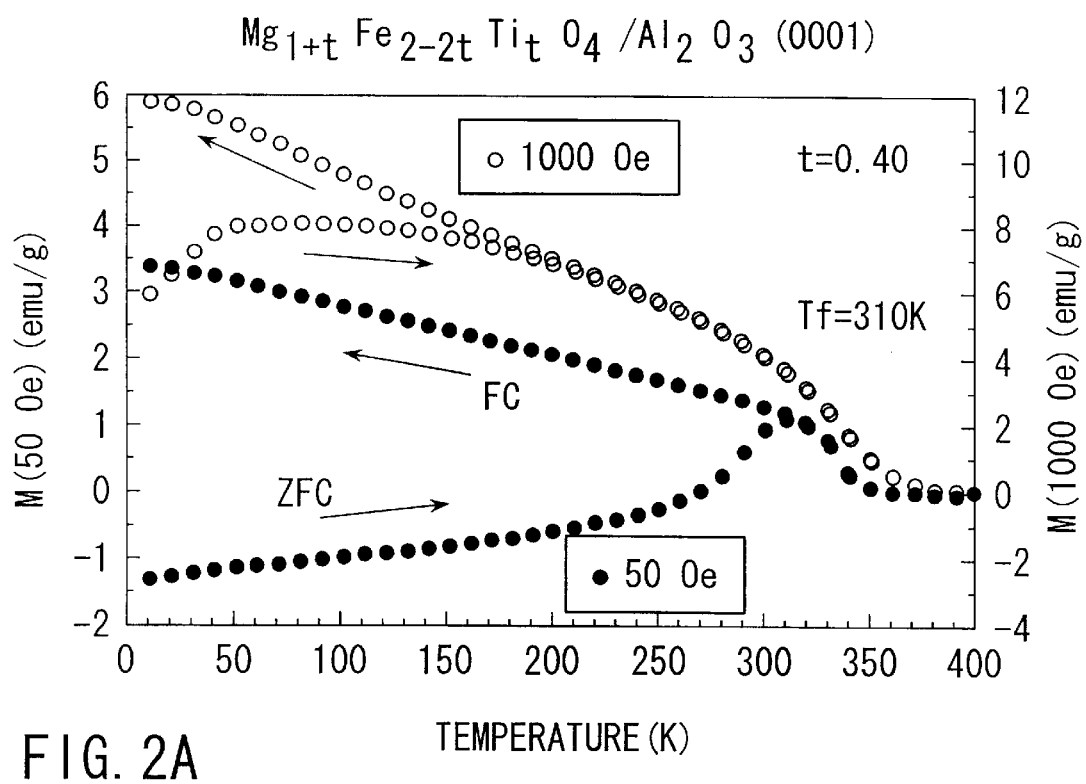
FIG. 2A is a graph showing temperature dependency of magnetic susceptibility for a $Mg_{1.4}Fe_{1.2}Ti_{0.4}O_4$ thin film formed on a sapphire single crystal substrate.
Figure 2B:
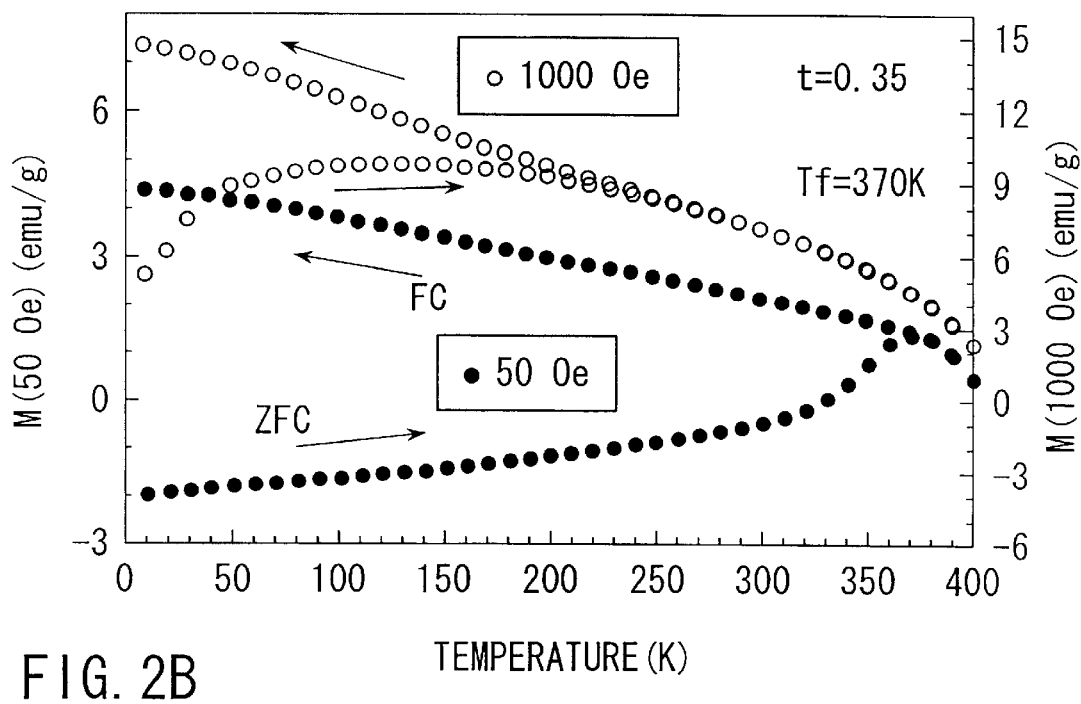
FIG. 2B is a graph showing temperature dependency of magnetic susceptibility for a $Mg_{1.35}Fe_{1.3}Ti_{0.35}O_4$ thin film formed on a sapphire single crystal substrate.

Each of FIGS. 2A and 2B shows temperature dependency of magnetic susceptibility for the $Mg_{1+t}Fe_{2-2t}Ti_tO_4$ thin film. FIG. 2A shows the result relating to the $Mg_{1.4}Fe_{1.2}Ti_{0.4}O_4$(t=0.4) thin film, and FIG. 2B shows the result relating to the $Mg_{1.35}Fe_{1.3}Ti_{0.35}O_4$(t=0.35) thin film.

As apparent from these graphs, a spin freezing temperature of 310 K is obtained for $Mg_{1.4}Fe_{1.2}Ti_{0.4}O_4$, and a spin freezing temperature of 370 K is obtained for $Mg_{1.35}Fe_{1.3}Ti_{0.35}O_4$. These values of spin freezing temperature are higher than those in the prior art.

Example 3

A substrate for forming a spinel ferrite thin film was changed to examine the effect of the substrate.

A substrate made of a sapphire single crystal substrate ($\alpha-Al_2O_3$) having a (0001) plane or a strontium titanate single crystal having a (111) plane and a $Mg_{1+t}Fe_{2-2t}Ti_tO_4$ (t=0.4) target were disposed in a laser deposition apparatus, followed by evacuating the apparatus to a high vacuum. An oxygen gas was introduced into the apparatus to set a pressure to $1\times10^{-5}$ Torr. Then, a spinel ferrite thin film represented by $Mg_{1.4}Fe_{1.2}Ti_{0.4}O_4$ was deposited on the substrate as in Example 1.

Figure 3:
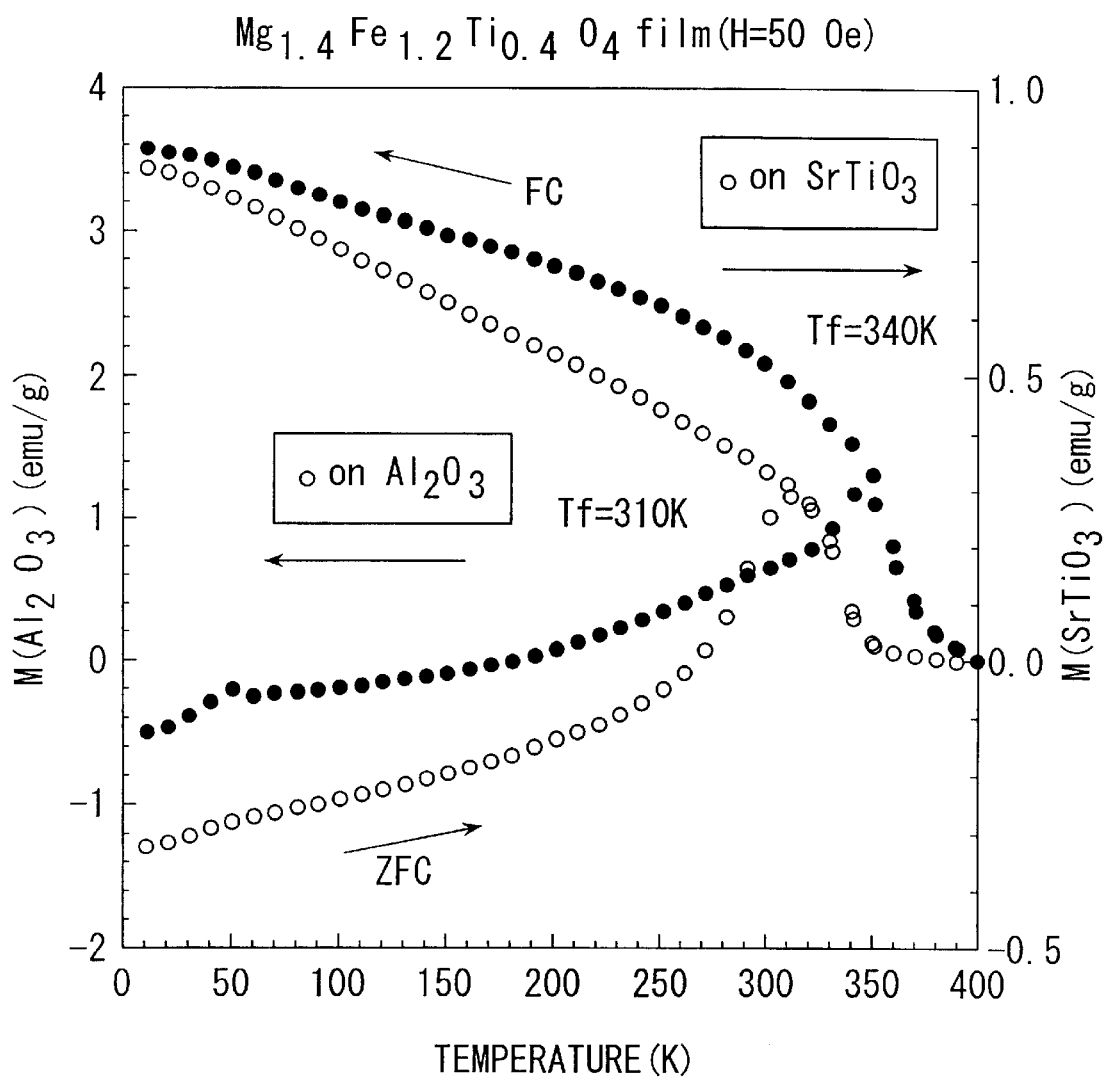
FIG. 3 is a graph showing temperature dependency of magnetic susceptibility for each of $Mg_{1.4}Fe_{1.2}Ti_{0.4}O_4$ thin films formed on a sapphire single crystal substrate and on a strontium titanate substrate, respectively.

FIG. 3 is a graph showing temperature dependency of magnetic susceptibility for the $Mg_{1.4}Fe_{1.2}Ti_{0.4}O_4$ thin films formed on the sapphire single crystal substrate or on the strontium titanate single crystal substrate. As apparent from the graph, where a strontium titanate single crystal is used as a substrate, the spin freezing temperature of the $Mg_{1.4}Fe_{1.2}Ti_{0.4}O_4$ thin film is 340 K, which is higher than that (310 K) in the case of using a sapphire single crystal as the substrate.

Example 4

The spin glass state was controlled by irradiating a spinel ferrite thin film with light, while applying to the thin film at least 30% of magnetic field relative to the coercive force Hc.

Figure 4A:
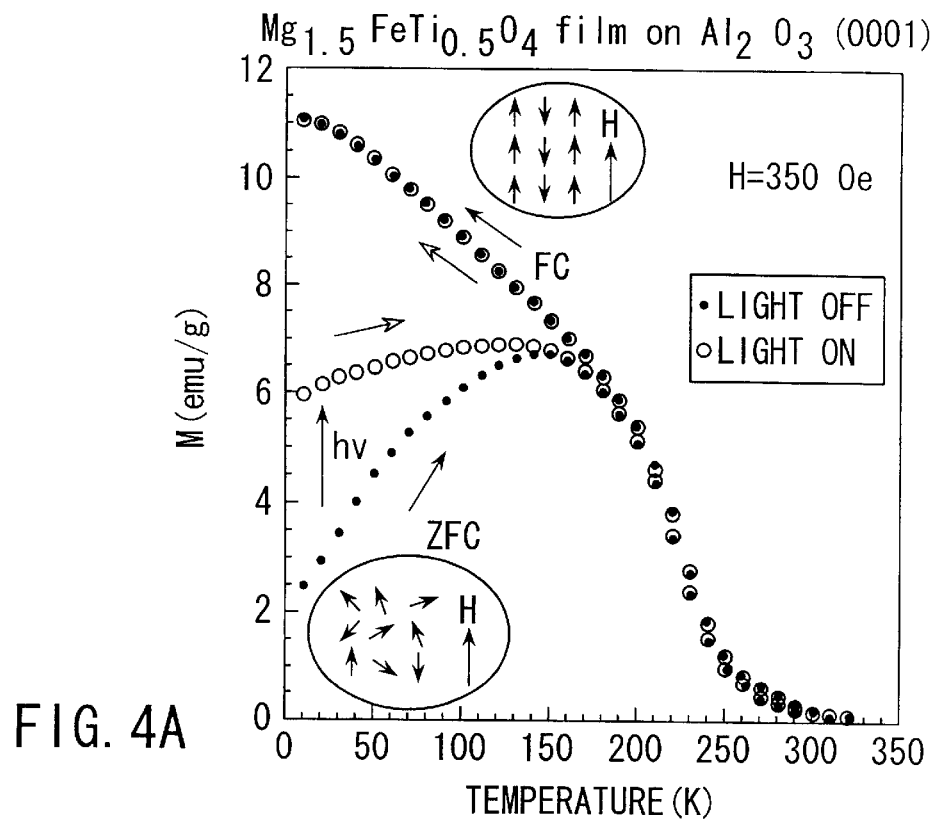
FIG. 4A is a graph showing temperature dependency of magnetic susceptibility for a $Mg_{1.5}FeTi_{0.5}O_4$ thin film formed on a sapphire single crystal substrate both before and after irradiation with light.

A sample of a $Mg_{1.4}FeTi_{0.5}O_4$ thin film deposited on a sapphire single crystal substrate having a (0001) plane was prepared as in Example 1. FIG. 4A shows temperature dependency of magnetic susceptibility of the sample both before and after the light irradiation. In this case, the sample was irradiated with white light with a magnetic field of 350 Oe applied to the sample. As shown in the graph, the magnetization is increased by the light irradiation in the zero magnetic field measurement under temperatures lower than the spin freezing temperature.

Figure 4B:
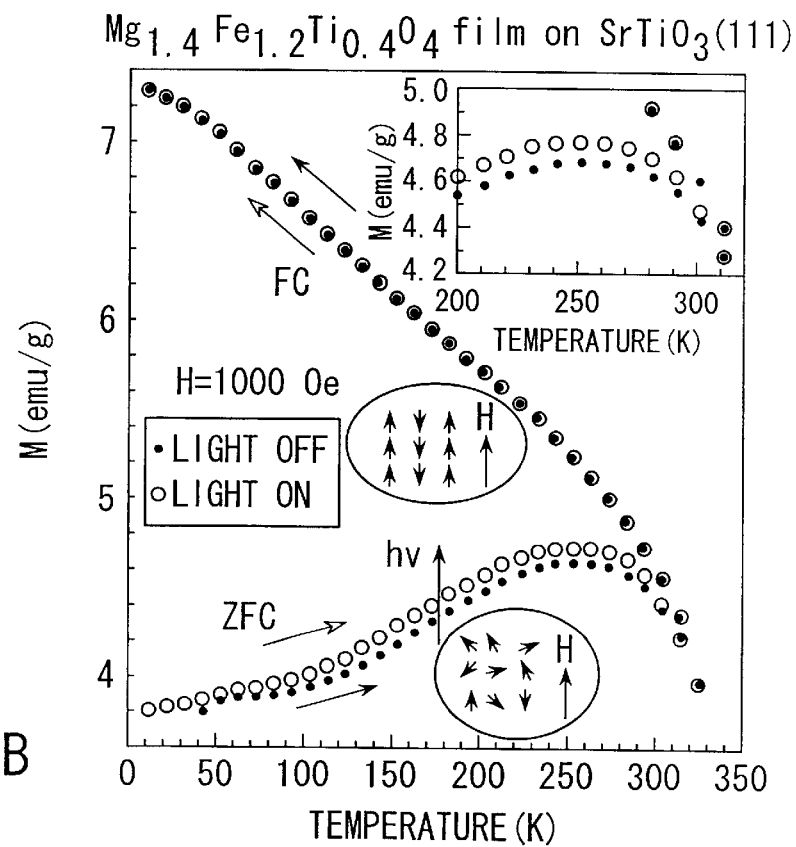
FIG. 4B is a graph showing temperature dependency of magnetic susceptibility for a $Mg_{1.4}Fe_{1.2}Ti_{0.4}O_4$ thin film formed on a strontium titanate single crystal substrate both before and after irradiation with light.

Also, a sample of a $Mg_{1.4}Fe_{1.2}Ti_{0.4}O_4$ thin film deposited on a strontium titanate single crystal substrate having a (111) plane was prepared as in Example 3. FIG. 4B shows temperature dependency of magnetic susceptibility of the sample both before and after the light irradiation. The magnetization is increased by the light irradiation in the zero magnetic field measurement under temperatures lower than the spin freezing temperature in this case, too.

Example 5

A sapphire single crystal substrate having a (0001) plane and a $Zn_{1-x}Co_xFe_2O_4$(x=0.5) target were disposed in a laser deposition apparatus, followed by evacuating the apparatus to a high vacuum. An oxygen gas was introduced into the apparatus to set a pressure to $1\times10^{-5}$ Torr. Then, the substrate temperature was set at 350 to 550° C., and the target was irradiated with a laser beam having a wavelength of 193 nm emitted from an ArF excimer laser so as to deposit a $Zn_{0.5}Co_{0.5}Fe_2O_4$ spinel ferrite thin film on the substrate.

Figure 5:
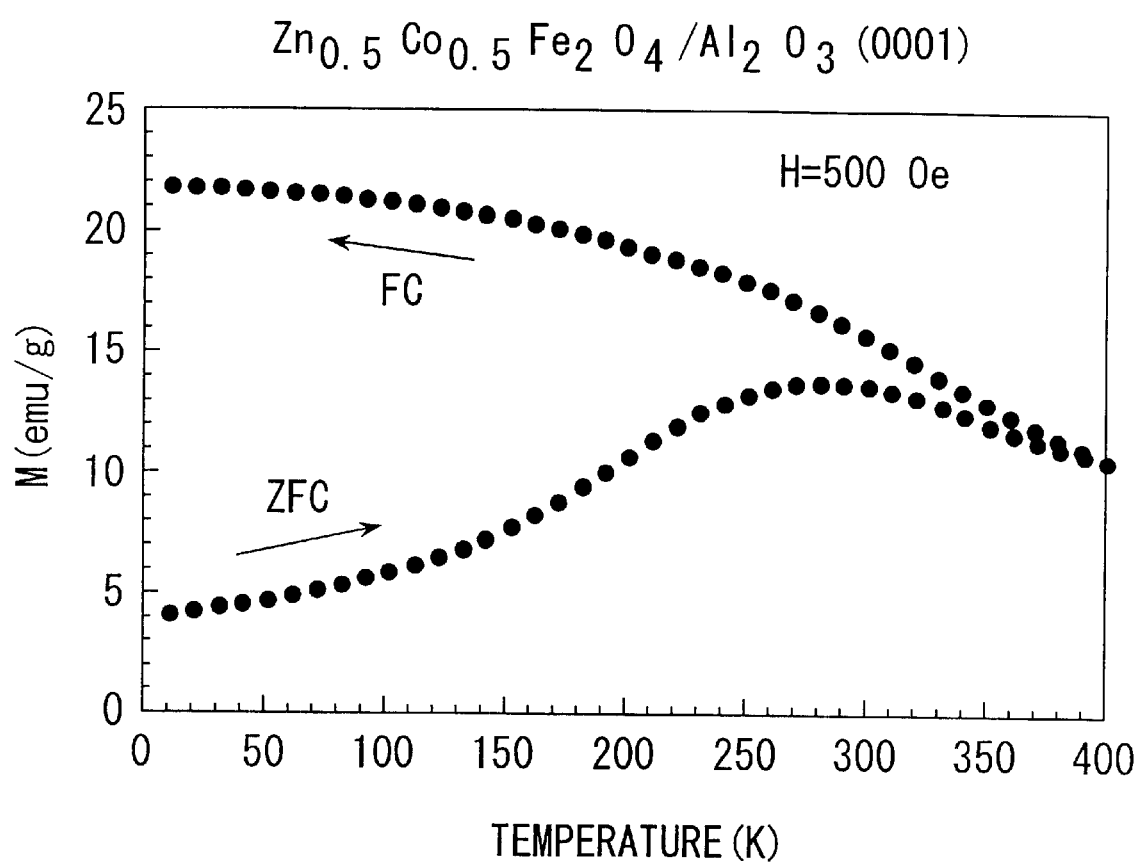
FIG. 5 is a graph showing temperature dependency of magnetic susceptibility for a $Zn_{0.5}Co_{0.5}Fe_2O_4$ thin film formed on a sapphire single crystal substrate.

FIG. 5 is a graph showing temperature dependency of magnetic susceptibility for the $Zn_{0.5}Co_{0.5}Fe_2O_4$ spinel ferrite thin film. As shown in the graph, it is possible to obtain a spin freezing temperature of 280 K.

As described above in detail, the present invention makes it possible to control the valence of iron ion and to introduce a lattice distortion by depositing a spinel ferrite thin film under a low oxygen partial pressure. As a result, the spin exchange interaction can be effectively increased so as to increase the width of selection of the materials that permits achieving a spin glass state at temperatures around room temperature. It is also possible to obtain a spinel ferrite thin film having a higher spin freezing temperature. For example, a thin film of $Mg_{1.35}Fe_{1.3}Ti_{0.35}O_4$ is found to be capable of maintaining the glass state up to 370 K. Further, the spin glass state of the spinel ferrite thin film of the present invention can be controlled by light under room temperature.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spinel ferrite thin film selected from the group consisting of compounds represented by the formula:

$$AE_{1+t}Fe_{2-2t}TM_tO_4$$

wherein AE represents an alkaline earth metal or an alkali metal, TM represents a transition metal, and t falls within a range of between 0.2 and 0.6, the spinel ferrite thin film having a thickness of 10 μm or less, wherein magnetization of the spinel ferrite thin film is controlled by light.

2. The spinel ferrite thin film according to claim 1, wherein the alkaline earth metal or the alkali metal is selected from the group consisting of magnesium and lithium, and the transition metal is selected from the group consisting of cobalt, titanium, zinc, vanadium, manganese, chromium and nickel.

3. The spinel ferrite thin film according to claim 1, wherein the compound is represented by the formula:

$$Mg_{1+t}Fe_{2-2t}Ti_tO_4$$

where t falls within a range of between 0.2 and 0.6.

* * * * *